United States Patent [19]

Alexander

[11] Patent Number: 4,887,759

[45] Date of Patent: Dec. 19, 1989

[54] DESOLDERING APPARATUS

[75] Inventor: Larry G. Alexander, Indianapolis, Ind.

[73] Assignee: Leads Metal Products, Inc., Indianapolis, Ind.

[21] Appl. No.: 223,392

[22] Filed: Jul. 25, 1988

[51] Int. Cl.⁴ ............................................. B23K 3/00
[52] U.S. Cl. ................................................... 228/20
[58] Field of Search ................ 228/125, 20 HT, 20 R; 219/227, 229, 236, 237, 238, 230

[56] References Cited

U.S. PATENT DOCUMENTS

| | | | |
|---|---|---|---|
| 3,172,382 | 3/1965 | Weglin | 219/227 |
| 3,842,240 | 10/1974 | Wakita et al. | 219/236 |
| 4,292,706 | 10/1981 | Fortune | 228/20 HT |
| 4,318,504 | 3/1982 | Rauchwerger | 228/20 HT |
| 4,660,249 | 4/1987 | Popovic | 228/20 HT |

Primary Examiner—Nicholas P. Godici
Assistant Examiner—Michael William Starkweather
Attorney, Agent, or Firm—Robert A. Spray

[57] ABSTRACT

Apparatus for desoldering, characterized by its suction and pressure effects being achieved by the stroking of a piston in an air cylinder. In the preferred embodiment, the suction effect for drawing in melted solder is forced by a spring, with venting of the pressure previously existing; and the pressure effect for ejecting the melted solder is by the reverse direction stroke of the piston, which not only causes the piston-stroke to pressurize the control tube but to impart energy to the spring for its subsequent suction-stroke operativity. The pressurizing and venting of the air cylinder are controlled by valving which controls the air cylinder's venting and connection to an associated source of air pressure; and the components provide the way by which the advantageous speed differential is obtained as to the suction and ejection effects, the suction being relatively slow for easy and assurance of solder pick-up, but the ejector effect being relatively fast, for sureness of ejection of the solder at the discharge station.

4 Claims, 1 Drawing Sheet

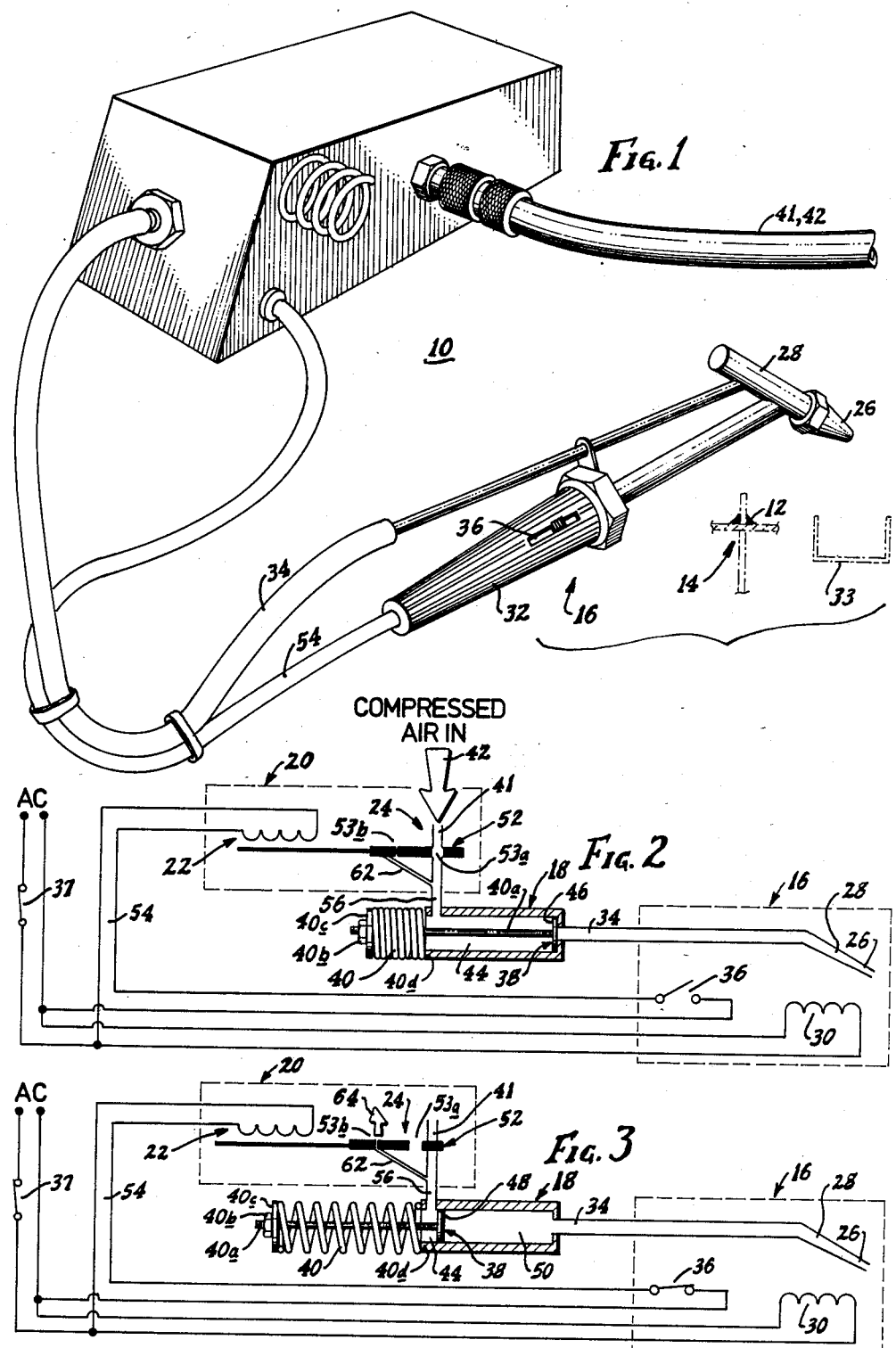

DESOLDERING APPARATUS

FIELD AND PRIOR ART BACKGROUND OF THE INVENTION

The present invention relates to the procedure of desoldering, i.e., the melting and removal of solder previously applied to a work object. Such de-soldering or solder-removal is typically needed in removing a component from a circuitboard, such as for repair and-/or exchange; and desoldering has been a commercial task for many years.

The procedure and need of desoldering as a commercial procedure has caused a long-term development of apparatus useful for in the procedure. Solder pick-up hand tools have long provided a heating unit for melting the solder to be removed, and a tube into which the solder may be drawn by suction.

The prior art has used various techniques and procedures, with various types of heated equipment, more or less successfully throughout the years. Suction bulbs, for example, have been used to draw up the molten solder and to then expel it when the tool has been moved to a discharge can.

Mechanical equipment has also been used to achieve the suction and the ejection sequences of operativity; and indeed, it is such mechanical equipment, as shown by the U.S. Pat. No. 3,822,035, issued Jul. 2, 1974 to Rudy L. Kopernak that seems to be the least remote from the present invention, of any apparatus known to the inventor, and thus contrast is specifically shown as to that Kopernak patent.

SUMMARY of the present INVENTION

In carrying out the invention in the preferred form here shown, there is provided a hand tool having a tip carrying a hollow tube, with heating means for the tip, and a handle by which the tip is supported and may be moved in its operativity of withdrawing solder from the work site and carrying it to an associated discard station. And like the prior art, the tool tube is provided with pneumatic tube means for optionally creating a vacuum in the tube for drawing solder into the tube and tube means, or a pressurization of the tube for ejecting the solder. Further like the prior art, there is provided switch means for controlling the pneumatic tube means and for controlling the heating means.

In accordance with the present inventive concepts, such prior art concepts are improved by providing novel means for providing the suction and the solder-ejection effects, more particularly by providing an air cylinder having a movable piston means therein and with spring means biasing the piston means towards a suction stroke, and with means supplying air at over-atmospheric pressure to the air cylinder, from an associated source of compressed air.

A solenoid valve controls both the admission and the venting of air from the cylinder, all providing that the vented cylinder lets the spring force the piston in the suction stroke, and air pressure in the cylinder forces the piston to create the ejection effect and force the spring to its spring-loaded condition to energize the subsequent suction stroke.

Further details of the construction, concept, and operativity are detailed below.

PRIOR art types of apparatus do not provide the particular advantages and characteristics here achieved In considering the nature of the combination and its concepts, and contrasting the inventive nature of the present concepts over prior art apparatus as known to the inventor, it is not only conceded but emphasized that there are desoldering apparatus and equipment which provide mechanized suction and ejection effects, mechanized in contrast to pressure bulb devices, and that such mechanized devices such as illustrated by the Kopernak patent mentioned above provide operational advantages over earlier techniques.

However, none of the equipment of the prior art, including that of the aforesaid Kopernak patent, or any other of current or prior use known to the inventor, have the effective and economical air cylinder features such as provided by the present invention; and, as a particular disadvantage of the prior art devices, including specifically the said patent which uses a bellows whose stroking is achieved by a motor with a circular driving effort, the prior art does not provide a combination whose components provide for an advantageous and automatically-obtained differentiation between a desired relatively long-length of time of the suction effect and a short length of time of the ejection effect.

These provide for the present invention ease of use by a lengthy solder pick-up, time coupled with a sort of a anti-clog operativity by forceful ejection.

MORE specific contrast to the prior art

The advantageous contrast of the present invention to the prior art may be perhaps best realized by a more particularized review of the different types of desoldering apparatus of the prior art. The prior art devices may be grouped into three general types; so each of those is now summarily described, all somehow creating a vacuum for solder pickup, and providing for the solder's discarding, although each is disadvantageous as now summarized, in comparison to the present invention:

(a) "Vacuum pump" type (whether it be continuous, or intermittent as by means of an ON/OFF switch): The vacuum pump creates a vacuum for pulling the molten solder off the board. However, the pump method requires filters to decrease the amount of solder, flux, and fumes pulled into the pump valves. The pumps are expensive, creating a high initial cost and increased repair costs. Vacuum pumps create loud and monotonous noises which are objectionable.

Operativity is difficult because operators with a continuous vacuum may tend to burn circuit boards, because, since the vacuum never stops, the operator may continue the heated pick-up to attempt to "vacuum up" all the solder, but inadvertently over-heating the board in the process.

In contrast to "vacuum pump" devices, the present invention has specific advantages of no filters to clean or change, no valves to get gummy or clog up, no need of replacement of expensive vacuum pumps, no constant and loud noises, and the contaminents are not drawn through the vacuum system but are ejected. Also, a desoldering unit of continuous vacuum type cannot be used for a soldering or re-soldering task.

In the present invention, the vacuum is present only during the vacuum or suction stroke in the air cylinder. Thus, with the present invention the circuit board is also permitted a moment of cooling, minimizing over-heating of the circuit board.

With squeeze bulb types, the bulb needs to be awkwardly large in order to achieve enough suction or vacuum effect.

(b) "Venturi" type (in which air pressure passes over an opening to create a vacuum): Venturis have to have constant air pressure across an opening to create the vacuum. Therefore, there is air pressure released continuously while desoldering. This is noisy; and contaminates are vacuumed through the system, which causes buildup on filters, etc., creating the need for cleaning and replacement.

Also, there is the operational difficulty, that because the venturi-induced vacuum can be constant, operators may tend to hold the tip on the board too long, overheating the board.

In contrast to "venturi type" devices, the present invention has specific advantages of no filters to clean or change, no valves to get gummy or clog up, and no loud and continuous noise from air exhaust; and contaminates are expelled from the system.

Moreover, the nature of the vacuum, which is a characteristic of the present invention, prevents inadvertent overheating of the circuit board, as explained above.

(c) "Bellows" type, as is represented by the Kopernak patent cited above: (The bellows creates a vacuum and a pressure, alternating each 180 degrees, as driven by an electric motor.) Production was never achieved with this mechanism because of its disadvantages, including problems with switches, and problems stopping the electric motor at specific 180 degree intervals. This method also uses outdated electronics, including: low output transformers, open connections, nonsolid state relays, and no wiring harnesses or circuit boards. It is heavy, large, and typically noisy, and does not provide the desired differentiation of effect-times discussed above, by which the present invention achieves a relatively long (although temporary) suction for vacuumatic solder-pickup effect and relatively short pressure effect for effective and quick solder-discharge.

Further, the present invention has advantages over a "bellows" system in that the present invention is relatively more economical and simple, with only one moving part (except in the solenoid valve), is compact and light weight, and it does not depend on complicated switches to operate the motor as in the bellows type.

THE INVENTION'S components and concepts are similar to those available in the prior art, except for the present concepts in particular, and in these combinations In a hindsight consideration of the present invention to determine its inventive and novel nature, it is not only conceded but emphasized that the prior art not only had mechanized suction and ejection, and hand tools with heaters and with pick-up tubes, etc. but even had component details used in other types of equipment or installations and which could be usable in this invention, if the prior art had had the guidance of the present concepts and the conception of the combination of features of the overall invention.

That is, it is emphasized that the prior art had several particulars:

a. The prior art had mechanical suction and ejection, and hand tools for the solder suction and ejection;

b. The prior art had air cylinders, although in devices of various types and purposes which are not part of the present combination;

c. The prior art had solenoid valves, although in devices of various types and purposes which are not part of the present combination;

d. The prior art had many kinds of electrical switches, even including switches controlling a plurality of controlled actions from a single control site, even a movable site;

e. The prior art had knowledge of pneumatic systems, and knew of their properties, their utility of pressurizing a movable piston or other component, venting, etc.;

f. The prior art knew of the desire for a long but limited vacuum time-length for fullness of solder pickup without having to re-energize the suction effect;

g. The prior art knew of the desire for forceful and quick ejection, and knew that quick pressure-buildup would achieve forcefulness;

h. The prior art knew of mechanisms, such as "quick return" mechanisms, by which one stroke or portion of a cyclical movement could be of a different length or speed than another portion of a cyclical mechanism; and i. The prior art knew that clogging of the pneumatic line was a disadvantage of prior art apparatus, and realized other disadvantages of prior types of desoldering apparatus.

Accordingly, the various concepts and components which are utilized and built upon in achieving the novel combination of the overall invention here are conceded and emphasized to have been widely known in the prior art in various uses; nevertheless, the prior art not having had the particular combination of concepts and details as here presented and shown as novel combinations different from the prior art and its suggestions, even only a fair amount of realistic humility, to avoid consideration of this overall invention improperly by hindsight, requires the concepts and achievement here to be realistically viewed as novel combinations, inventive in nature.

BRIEF DESCRIPTION OF THE DRAWINGS

The above description of the novel and advantageous desoldering apparatus, with its advantageous combination of components, is of somewhat introductory and generalized form. More particular details, concepts, and features are set forth in the following and more detailed description of an illustrative embodiment, taken in conjunction with the accompanying drawings, which are of somewhat schematic and diagrammatic nature, for showing of the inventive concepts as are illustrated in this embodiment.

In the drawings:

FIG. 1 is a perspective pictorial view of a desoldering system embodying the control means of the present invention, although, being in the control unit the control means is not visible in this view; and the soldered work-site and discard dump are indicated only schematically;

FIGS. 2 and 3 are schematic diagrams of the control components and the energizing circuitry, and in which:

FIG. 2 illustrates the components in a spring-loaded and air-loaded standby condition or mode just after a dispensing of solder from a previously de-soldering action, and as the parts would be until the moment just prior to a subsequent solder-withdrawal or desoldering pickup task; and FIG. 3 illustrates the components in a condition or mode in which a solder-withdrawal or desoldering pickup task has just occurred, by the solenoid actuation of closing off the compressed air source and venting the air cylinder, permitting the air cylinder's piston spring to move the piston in a suction-achieving stroke as to the tubing to the desoldering pickup tool.

DETAILED DESCRIPTION OF PREFERRED EMBODIMENT

As shown in the drawings, the overall apparatus 10 for removing solder 12 from a work site 14 is shown with its general components (here mentioning concepts of both the prior art and of the present invention) including a hand tool 16, an air cylinder 18, and a solenoid valve 20 having both an electric control circuitry means 22 and valving 24; and these general components are now described as to their nature and operativity in the overall combination 10.

The tool 16 as illustrated is of conventional or prior art nature, having a working tip 26, which carries a hollow tube 28 for drawing up, holding and carrying, and ejecting the removed solder 12. The tool 16 also carries heating means 30 for the tip 26/28; and the tube 28 and heating means 30 are carried on a handle 32 by which the tip 26 and the other parts of the tool 16 may be manually held and manually moved by the worker in the operation of withdrawing solder 12 from the work site and carrying it to whatever is provided to be the associated discard station 33.

Also, as in the prior art, the tool is hollow pickup tube 28 is shown provided with pneumatic tube means 34 for the vacuum operativity, i.e., for creating at the option of an operator a vacuum in the tool's pick-up tube 28 by which solder 12 may be drawn into the tube 28 and tube means 34, but also at the option of the operator providing an over-atmospheric pressurization of the tube means 34 and the tube 28, which provides that solder 12 which has been drawn into the tube 28 and tube means 34 may be ejected or dispensed.

Prior art nature is also provided by electric switch means 36, here provided on the handle 32 for the operator's controlling of the pneumatic tube means 34 as to its pneumatic effects described herein, and for the operator's controlling of the heating means 30. The AC line switch components 37 energize the tip heater 30 and, depending on the setting of the switch 36, also energize the solenoid valve circuitry 22, and they are diagrammatically shown in FIGS. 2 and 3 as spaced on the circuitry from handle switch 36; but their physical location is no part of the present invention.

The operativity of the prior art components specified above will now be described in connection with the advantageous novel combination which uses those prior art concepts and components but integrated into the novel combination illustrated by the preferred embodiment shown in the drawings and now described more particularly.

According to concepts of the present invention, the improvements for the desoldering apparatus 10 comprise, in combination, the concept of the provision of the air cylinder 18 shown as having a movable piston means 38 in the cylinder 18, and having spring means 40 which bias the piston means 38 in a certain direction (here leftward) which as described herein is the suction-stroke direction or stroke of the piston means 38, together with the concept of providing other co-operating features as now described. The spring 40 is shown as a compression spring sleeved around the piston rod 40a and disposed exteriorly of the cylinder 18, and extending between a nut 40b and disc 40c on the outer (here left) end of the piston rod 40a and the left end 40d of the cylinder 18; however, it is not the particular nature of the spring 40 which is here significant but it is its operativity as herein described.

Compressed air, from an air-source inlet conduit or tube 41 leading from an associated compressed air source 42, supplies air at over-atmospheric pressure to the air cylinder 18, into a cylinder portion which, for description is called a first or first air cylinder chamber 44, of the air cylinder 18, which is the chamber 44 which is on a first side 46 of the piston means 38, the air pressure in the first air cylinder chamber 44 having caused the piston 38 to have moved (rightward on the drawings) in an opposite direction, this "opposite-direction" (FIG. 2) stroke of the piston 38 having thereby caused a storage of energy in the spring means 40 for achieving biasing of the piston means 38 (leftward as here shown) toward suction stroke operativity, by the energy stored in the spring 40.

That "opposite direction" (rightward, as per FIG. 2) stroke does more than load the spring 40, as shown herein.

As shown, the tube means 34 leading to the tool 16 connects the tool's tube 28 with the air cylinder 18 in the cylinder portion 50 on the side 48 (here the right side) of the piston means 38 opposite to that of the air cylinder 18's chamber 44 which is the chamber 44 connectable to the solenoid valve means 20, as further detailed herein, that "opposite cylinder chamber" being indicated by reference numeral 50.

The solenoid valve 20, as mentioned above, is a piece of equipment having an electric control solenoid 22 which controls operativity of a valve member 52 (FIG. 2 and 3) of valving 24, and the valving or valve means 24 provides pneumatic circuitry shown as operatively connected to the source 42 of compressed air and to the air cylinder 18; and, in the form schematically shown, the valve 52 provides both a pressure line valve means and a vent lines valve means, the operativity and effect of the valving 24/52 being described more particularly below.

The particulars of the valving 52 are not parts of the present invention concepts; but to describe the form of illustrative valving 52 shown, the valving 52 is noted as being of "slide valve" type in which there are provided a transverse, spaced pair of ports or passages 53a and 53b. As shown, the inlet pressure valve port 53a provides for pressurizing the air cylinder chamber 44 (FIG. 2), and the vent valve port 53b provides (FIG. 3) for venting that air cylinder chamber 44.

With such a solenoid-controlled valve 20, herein called just a "solenoid valve" 20, the valve member 52 is energizable by the switch 36 and electric circuitry 54 to optionally interconnect the valve 20's outlet passage 56 leading to or communicating with the (here leftward) air cylinder chamber 44, thus providing a pressure-line valve means operativity for providing an operative connection between the compressed air source 42, the valve 20's inlet pressure port 53a and inlet passage 41, and the air cylinder chamber 44 (FIG. 2); or, optionally, the valve 20 may be utilized (under control of switch 36 and valve control 22) to provide that the solenoid valve means 20/24/52 serves as a vent-line venting means for venting air from the air cylinder 18's chamber 44, per FIG. 3.

Such venting is schematically shown (FIG. 3) by venting, out a vent passage 62 and vent 64 of the valve means 20, by movement of the valve member 52 to schematically show an interconnection of the valve means 20's outlet passage 56 and its vent passage 62 and vent port 53b of the valve member 52, with valve vent 64.

At this point it is reminded that the solenoid valve 20 as a unit of equipment is not asserted to be of inventive nature, except only, as a controlled valving mechanism, it is an operative part of the overall combination; and thus its components are here intended to be designated only schematically, e.g., as to the same valve 52 being itself both a pressure-line valve, controlling (FIG. 2) open and closed condition of the pressure line 42/53a/56 as to a pressurizing of the air cylinder chamber 44, but the same valve 52 as also a vent-line valve (FIG. 3) controlling open and closed communication of that air cylinder chamber 44 with the vent outlet 64.

Suction-effect in tool-tube 28 and tube means 34, of that venting operativity (FIG. 3) 44/56/62/53b/64 is now shown. That is, such venting of the air cylinder 18's chamber 44 permits the spring means 40, then unrestrained by pressure in cylinder chamber 44, to move the piston means 38 in the direction which is called the "certain" direction (here leftward FIG. 3), and that movement of the piston means 38 creates a limited-time although a relatively long-duration (in comparison to the solder-ejection time) vacuum in the air cylinder 18's chamber 50, i.e., the (rightward) chamber 50 including piston face 48 of the piston means 38; and this expansion of the cylinder chamber 50, due to movement (left) of the piston 38, correspondingly also creates that "limited but long" vacuum in the tube means 34 and in the tool tube 28, for drawing into the tool tube 28 and the tube means 34 the solder 12 to be removed from the work site.

Further in terms of the control operativity in the overall combination, it will be noted that the control means 22/36 for the valve means 24/52 is capable of achieving, by a single movement of the slide valve 52, the moving of the pressure-line valve means 52 (considering schematically the valve member 52 as a part of the pressure line 42/53a/56/44) to (a) closed position (FIG. 3) in which the valve member 52 blocks the communication of air from the compressed air source 42 to the air cylinder 18's chamber 44 on the side 46 of the piston 38, and also achieves (still FIG. 3) moving of the valve member 52 (considering it as vent-line valve means 52 as part of vent-line 44/56/62/53b/64) to (b) an open venting position of interconnection of the air cylinder 18's chamber 44 and the venting means 62/64.

Such leftward movement of the piston 38 from its position in FIG. 2 to that of FIG. 3 is involved with what may be called the suction-stroke operativity of the piston 38; and now will be described the solder-ejection or pressurized stroke of the piston 38.

As to the solder-ejection or pressurized stroke (rightwardly from FIG. 3 position to the FIG. 2 position) of the piston 28 for ejection of solder 12 at the discharge dump can 33 or station, it will be noted that utilization is made of the solenoid valve means 20 also having control effect by its control means 22 being capable of moving the pressure-line valve means 52 (rightwardly here) to (c) an open position (FIG. 2) in which the components 41/53a are open to the passage 56, and thus the cylinder's chamber 44 is open for communication of air from the air line 41 and its compressed air source 42, to the air cylinder 18's chamber 44; and, in the form shown, this operativity also moves the valve 52 (then acting as a vent-line valve means) to (d) a closed (FIG. 2) position blocking the communication of the air cylinder 18's chamber with the venting means 62/64.

OPERATIONAL SUMMARY

The arrangement as shown and described provides operativity as follows:

(1) First, assume that the solenoid valve means 20's pressure-line valve means 52 is in open position "c" as per FIG. 2, in a standby condition in which the air cylinder 18's chamber 44 is open to the air pressure line 41 and air source 42; and, in action as a vent-line valve means, the valve member 52 is in vent-closed position "d". In that setting of valve member 52 (FIG. 2), the air pressure in the air cylinder 18 on the "first" side 46 of the piston means 38 will have caused the piston means 38 to have moved in what is called the "opposite" direction (here rightward), this movement of piston 38 having been against the bias of the spring means 40, and thus storing energy in the spring means 40 as mentioned above as a part of the operational cycle.

Further, assuming that the user then positions the tool 16 at the desired place to remove solder 12, thus operatively adjacent the work site, the user may operate the switch means 36 to so energize circuitry 54 to control the solenoid valve means 20's control means 22 to cause the solenoid valve means 20's pressure-line valve means 24/52 to go to a pressure-closed position "a," closing or blocking pressure to air cylinder chamber 44 from the air source 42, as per FIG. 3.

The action of the switch 36 will have caused the vent-line valve means 24/52 to go (FIG. 3) to open vent position "b," venting (via 53b/64) air cylinder chamber 44; and thus the bias of the spring means 40 will cause the spring 40 to move the piston means 38 in the "certain" direction (here leftward), thus establishing a vacuum accordingly in the expanding cylinder chamber 50, and in the tube means 34 and tool tube 28, all this being operative to withdraw solder 12 from the work site 14.

Next in the operational cycle, assuming that the user moves the tool 16 to the discard station, the user may actuate the tool to achieve a dispensing of solder just drawn into the tool tube 28 (i.e., by achieving the FIG. 3 position) by actuating the switch means 36 to control the solenoid valve means 20's control means 22 to cause the solenoid valve pressure-line valve means 24/52 to go to FIG. 2 or inlet open position "c" admitting air from source 42 to the air cylinder chamber 44, and also causing the vent-line valve means 24/52 to go to closed position "d" which blocks venting at 62/64 from the air cylinder chamber 44, as per FIG. 2.

In this FIG. 2 setting of the valve means 24/52, and against the bias of the spring means 40, the air pressure from source 42 now admitted to the air cylinder 18 on the side 46 of the piston 38, as a part of chamber 44, will cause the piston means 38 to move in what has been called the "opposite" direction (here rightward) thus establishing over-atmospheric pressure in the air cylinder 18 on the "opposite" or chamber 44 side 46 of the piston means 38; and this FIG. 2 also establishes above-atmospheric pressure in the tube means 34 and in the tool tube 28, forcing a dispensing or forceful ejection of solder 12 which had been previously withdrawn from the work site and into the tool tube 28 and the tube means 34.

It should be noted that the components of the preferred embodiment shown and described provide a particularly desired operativity of relatively long or slow suction stroke of piston 38, with correspondingly relatively long although limited-time pick-up operativity, but, and in contrast, the operativity is a relatively fast pressure stroke of piston 38 to achieve a quick and forceful dispensing of solder 12 at the discharge station.

This is an advantageous feature provided by the components of the combination; i.e., the components of the combination provide that the desired relative-speed effect may be attained by providing the spring means 40 and the vent means 64 to be such, in comparison to the pressure of air in the associated source 42 and the operative area of the piston means 38 against which the air from source 42 exerts its pressure, that the FIG. 3 movement of the piston means 38 in the certain (here leftward) direction by the spring 40 and venting at 64, which produces an expansion of the cylinder chamber 50, and solder-withdrawing vacuum in the tool tube 28 and in tube means 34, is relatively slower than the movement of the piston means 38 in the direction (here rightwardly) of decreasing size of cylinder chamber 50, which (FIG. 2) achieves the above-atmospheric pressure in the tube means 34 leading to the tool 16, which pressure achieves solder-ejection promptly when the switch 36 is actuated for the ejection mode.

Thus, the components of the preferred combination provide the means for assuring a relatively long (although limited) period of vacuum existence as is advantageous for withdrawing solder 12 from the work site, but a forceful operativity of solder 12 dispensing by a rapid build-up of the above-atmospheric pressure in the tube means 34.

Convenience for the operator is provided by providing that the control means of the solenoid valve means 20, as provided by the circuitry of the solenoid valve 20, switch 36, and control line circuitry 54, provides that the pressure-line valve means 24/52 is open (FIG. 2), in position "c," admitting air pressure from source 42 to the air cylinder chamber 44, and the vent-line valve means 24/52 is closed in position "d" blocking venting of chamber 44 out vent 64 except if the switch means 36 is actuated to achieve the opposite, i.e., to achieve the pressure-line valve means 24/52 to be in closed position "a" blocking communication (FIG. 3) of air source 42 with chamber 44, and the vent-line valve means 24/52 to be in open position "b" venting chamber 44 to the vent 64.

This "normal setting" of the switch 36, and hence of its operativity, provides that the tool's pick-up tube 28 is always ready to be switched to suction mode, except during dispensing, and the suction effect of piston 38's leftward travel (from FIG. 2 to FIG. 3) will not be "used up" prematurely.

CONCLUSION

It is thus seen that a desoldering apparatus, having components in combination as herein describing and constructed and used according to the inventive concepts herein set forth, provides a combination of novel concepts of a desirable and advantageous device, yielding the advantages of a desoldering device which provides ease and sureness of use in both solder draw-up and ejection, having substantially clog-free operativity, and being conceptually different from the prior art even though desoldering equipment with mechanical/pneumatic features as a basic concept have been known for years; yet significantly this particular combination of prior art and components in a novel combination has not been suggested by the prior art, this achievement being a substantial and advantageous departure from prior art. And particularly is the overall difference from the prior art significant when the non-obviousness is viewed by a consideration of the subject matter as a whole, as integrally building on prior art yet incorporating into the combination features and concepts different from the prior art, in contrast to merely these details of novelty themselves, and further in view of the prior art's type of desoldering devices teaching away from the particular and inter-related concepts and features of the present invention, and the prior art failing to achieve the particular advantages and operational characteristics of the present invention.

In summary as to the nature of these advantageous concepts, their inventiveness is shown by novel features of concept and construction shown here, in novel and advantageous combination, not only being different from all the prior art known, but because the achievement is not what is or has been suggested to those of ordinary skill in the art, especially considering this as comprising components and features which except in the present combination may be considered to be similar in nature to what is well known to many manufacturers, surely including most of the many makers and users of most desoldering or similar devices, for many years, the entire world over. No prior art has suggested the modifications of any prior art to achieve the particular novel concepts here achieved in the combination of this invention, with the various features providing the particular benefits and operativity of this invention.

Accordingly, it will thus be seen from the foregoing description of the invention according to this illustrative embodiment, considered with the accompanying drawings, that the present invention provides new and useful concepts of a novel and advantageous desoldering device having and yielding desired advantages and characteristics in formation and use, and accomplishing the intended objects, including those hereinbefore pointed out and others which are inherent in the invention.

Modifications and variations may be made without departing from the scope of the novel concepts of the invention; accordingly, the invention is not limited to the specific embodiment, or form or arrangement of parts herein described or shown.

I claim:

1. Apparatus for desoldering a work site which has received solder, the apparatus comprising:
    a tool having a tool tip carrying a hollow tip tube, heating means for the tool tip, and a handle by which the tool tip is supported and may be moved in its operativity of withdrawing solder from the work site and carrying it to an associated discard station,
    pneumatic tube means, which include the tip tube, being provided for creating, at the option of an operator, a vacuum in the tip tube, by which solder may be drawn into the tip tube and pneumatic tube means, or an over-atmospheric pressurization of the tip tube, by which solder drawn into the tip tube and pneumatic tube means may be dispensed therefrom,
    switch means for controlling the pneumatic tube means and for controlling the heating means,
    the improvement for such desoldering apparatus, comprising, in combination, an air cylinder having a movable piston means therein and having spring means biasing the piston means in a certain direction, means supplying air at over-atmospheric pressure to the air cylinder, from an associated source of compressed air, on a first side of the piston means to move the piston means in an opposite direction, achieving a storage of energy in the spring means for achieving the said biasing of the piston means, the pneumatic tube means connecting the tip tube with the air cylinder on the side of the piston means opposite to that connectable to the solenoid valve means mentioned below, a solenoid valve means having pneumatic circuitry operatively connected to the source of compressed air and to the air cylinder, with a pressure-line valve means for providing an operative connection therebetween, the solenoid valve means having a vent-line venting means for venting air from the air cylinder, the solenoid valve means having control means which is capable of moving the pressure-line valve means to (a) a closed position, blocking the communication of air from the compressed air source to the air cylinder, and moving the vent-line valve means to (b) an open position to interconnect the air cylinder and the venting means, the venting of the air cylinder permitting the spring means to move the piston means in the said certain direction, and the said movement of the piston means in the said certain direction creating a vacuum in the air cylinder on the said opposite side of the piston means and thus also creating a vacuum in the pneumatic tube means and in the tip tube, for drawing into the tip tube and the pneumatic tube means the solder to be removed from the work site.

the control means of the solenoid valve means also being capable of moving the pressure-line valve means to (c) open position opening the communication of air from the compressed air source to the air cylinder, and moving the vent-line valve means to (d) a closed position blocking the communication of the air cylinder with the venting means, the arrangement providing operativity as follows:

with the solenoid valve means' pressure-line valve means in open position "c", and its vent-line valve means in closed position "d", the air pressure in the air cylinder on the first side of the piston means will have caused the piston means to have moved in said opposite direction, against the bias of the spring means, and storing energy in the spring means;

and, assuming that the user then positions the tool operatively adjacent the work site, the user may operate the switch means to control the solenoid valve means' control means to cause the solenoid valve means' pressure-line valve means to go to closed position "a" and the vent-line valve means to open position "b," whereupon the bias of the spring means will cause it to move the piston means in the said certain direction, establishing a vacuum momentarily in the pneumatic tube means and tip tube, operative to withdraw solder from the work site;

and then, assuming that the user moves the tool to the discard station, the user may actuate the switch means to control the solenoid valve means' control means to cause the solenoid valve pressure-line valve means to go to open position "c" and the vent-line valve means to go to closed position "d", (whereupon, against the bias of the spring) means, the air pressure in the air cylinder on the first side of the piston means will cause the piston means to move in said opposite direction, establishing over-atmospheric pressure in the air cylinder on the said opposite side of the piston means, thus also establishing above-atmospheric pressure in the pneumatic tube means and tip tube, forcing a dispensing therefrom of solder which had been withdrawn from the work site and into the tip tube and the pneumatic tube means.

2. The invention as set forth in claim 1, in a combination in which the spring means and the vent means are such, in comparison to the pressure of air in the associated source and the operative area of the piston means against which the said air exerts its pressure, that the movement of the piston means in the said certain direction, which achieves the said vacuum in the pneumatic tube means, is relatively slower than the movement of the piston means in the said opposite direction, which achieves the above-atmospheric pressure in the pneumatic tube means, thereby assuring a relatively long period of vacuum existence for withdrawing solder from the work site, but a forceful operativity of solder dispensing by a rapid build-up of the above-atmospheric pressure in the pneumatic tube means.

3. The invention as set forth in claim 1, in a combination in which the control means of the solenoid valve means provides that the pressure-line valve means is open in position "c" and the vent-line valve means is closed in position "d" except if the switch means is actuated to achieve the pressure-line valve means to be in closed position "a" and the vent-line valve means to be in open position "b".

4. The invention as set forth in claim 2, in a combination in which the control means of the solenoid valve means provides that the pressure-line valve means is open in position "c" and the vent-line valve means is closed in position "d" except if the switch means is actuated to achieve the pressure-line valve means to be in closed position "a" and the vent-line valve means to be in open position "b".

* * * * *